US011156928B2

(12) United States Patent
Nijmeijer et al.

(10) Patent No.: US 11,156,928 B2
(45) Date of Patent: Oct. 26, 2021

(54) ALIGNMENT MARK FOR TWO-DIMENSIONAL ALIGNMENT IN AN ALIGNMENT SYSTEM

(71) Applicant: ASML Holding N.V., Veldhoven (NL)

(72) Inventors: Gerrit Johannes Nijmeijer, Stamford, CT (US); Junqiang Zhou, Wilton, CT (US); Piotr Jan Meyer, Auburndale, MA (US); Jeffrey John Lombardo, Roxbury, CT (US); Igor Matheus Petronella Aarts, Port Chester, NY (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 16/615,882

(22) PCT Filed: May 2, 2018

(86) PCT No.: PCT/EP2018/061091
§ 371 (c)(1),
(2) Date: Nov. 22, 2019

(87) PCT Pub. No.: WO2018/215173
PCT Pub. Date: Nov. 29, 2018

(65) Prior Publication Data
US 2020/0124995 A1    Apr. 23, 2020

Related U.S. Application Data

(60) Provisional application No. 62/510,504, filed on May 24, 2017.

(51) Int. Cl.
*G03F 9/00* (2006.01)

(52) U.S. Cl.
CPC .......... *G03F 9/7046* (2013.01); *G03F 9/7049* (2013.01); *G03F 9/7076* (2013.01); *G03F 9/7088* (2013.01)

(58) Field of Classification Search
CPC .... G03F 9/7076; G03F 9/7046; G03F 9/7049; G03F 9/7088; G03F 7/70258; G03F 9/7084
See application file for complete search history.

(56) References Cited

U.S. PATENT DOCUMENTS 7,068,833 B1 * 6/2006 Ghinovker .......... G03F 7/70633
                                                     382/143
8,610,898 B2    12/2013 Khuat Duy
(Continued)

FOREIGN PATENT DOCUMENTS

| JP | H02112223 A | 4/1990 |
| JP | 2004-508711 A | 3/2004 |

(Continued)

OTHER PUBLICATIONS

International Search Report and Written Opinion of the International Searching Authority directed to related International Patent Application No. PCT/EP2018/061091, dated Aug. 20, 2018; 9 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

An alignment mark for determining a two-dimensional alignment position of a substrate is discussed. The alignment mark includes an array of patterns. The array of patterns includes a first set of patterns and a second set of patterns arranged. The first set of patterns is arranged in a first sequence along a first direction. The second set of patterns is arranged in a second sequence along the first direction. The second sequence is different from the first sequence. Each pattern of the array of patterns is different from other patterns of the array of patterns that are adjacent to the each pattern.

21 Claims, 7 Drawing Sheets

(56) References Cited

U.S. PATENT DOCUMENTS

| | | |
|---|---|---|
| 9,355,923 B2 | 5/2016 | Yoshino |
| 9,377,700 B2 | 6/2016 | Schuster et al. |
| 10,101,513 B2 | 10/2018 | Jung et al. |
| 2006/0061743 A1 | 3/2006 | Den Boef et al. |
| 2007/0052113 A1 | 3/2007 | Morokkey et al. |
| 2008/0112609 A1 | 5/2008 | Inoue |
| 2009/0176167 A1 | 7/2009 | Hulsebos et al. |
| 2009/0195768 A1 | 8/2009 | Bijnen et al. |
| 2019/0129319 A1* | 5/2019 | Garcia Granda ... G03F 7/70641 |

FOREIGN PATENT DOCUMENTS

| | | |
|---|---|---|
| JP | 2012-060120 A | 3/2012 |
| JP | 2015-095631 A | 5/2015 |
| JP | 2015-518285 A | 6/2015 |
| JP | 2016-533540 A | 10/2016 |
| WO | WO 0219415 A1 | 3/2002 |

OTHER PUBLICATIONS

International Preliminary Report on Patentability directed to related International Patent Application No. PCT/EP2018/061091, dated Nov. 26, 2019; 7 pages.

* cited by examiner

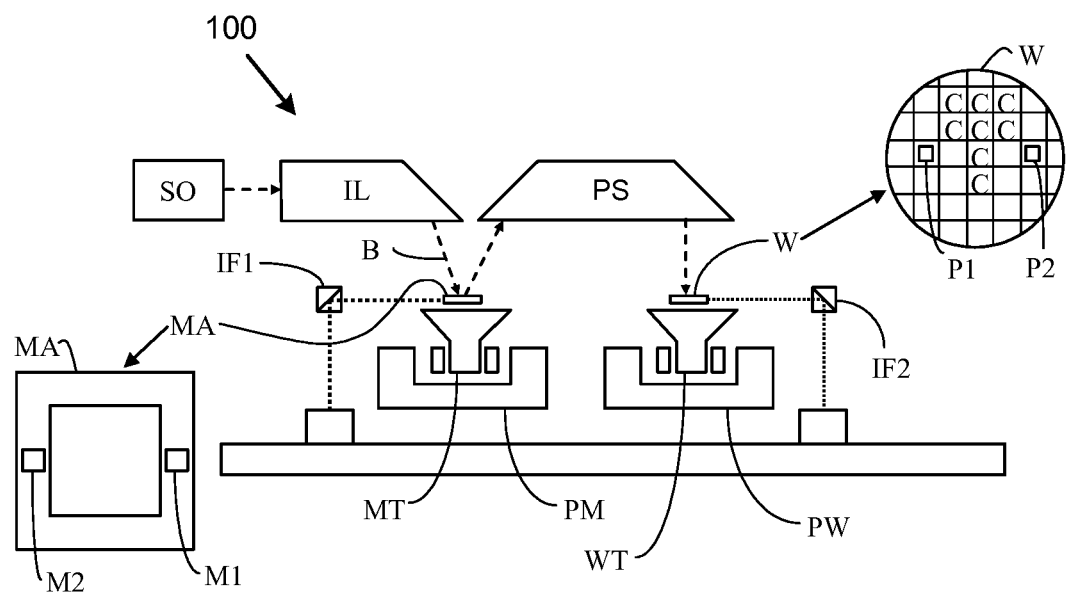
FIG. 1A
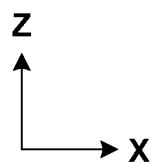

ALIGNMENT MARK FOR TWO-DIMENSIONAL ALIGNMENT IN AN ALIGNMENT SYSTEM

CROSS-REFERENCE TO RELATED APPLICATIONS

This application claims priority of U.S. Provisional Patent Application No. 62/510,504, which was filed on May 24, 2017, and which is incorporated herein in its entirety by reference.

FIELD

The present disclosure relates to an alignment system and alignment marks that may be used, for example, in a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object (e.g., substrate table or wafer stage WT shown in FIGS. 1A and 1B). Lithographic apparatus may use an alignment system for detecting positions of the alignment marks for aligning the substrate with respect to, for example, a projection system and/or the patterning device to ensure accurate exposure from the patterning device.

The alignment process may include a coarse wafer alignment (CWA) process and a fine wafer alignment (FWA) process. In the FWA process, a number of fine alignment marks may be measured with a very high alignment accuracy (e.g., alignment accuracy less than about 1 nm). To ensure this high alignment accuracy, prior to the FWA process, the CWA process may scan coarse alignment marks to get a good indication where the wafer may be positioned. This information may be used to determine where the fine scans in the FWA process may be executed. The CWA process may provide an alignment accuracy within about 100 nm.

The CWA process typically scans a first coarse alignment mark (CAM) for determining a position in a first direction (e.g. along X-axis) and scans a second CAM for determining a position in a second direction (e.g. along Y-axis). These first and second CAMs are positioned in separate locations with respect to each other and are scanned separately at different times. Detection of two separate CAMs at different times and locations may result in alignment errors and may also require a long time to align substrate in two directions. Furthermore, the use of two different CAMs reduces the "silicon real estate" in integrated circuits that may be otherwise used for production of, for example, devices or other functional elements of the integrated circuit.

SUMMARY

Accordingly, there is a need for a coarse alignment mark (CAM) that may be used to determine positions in two directions (e.g., in X- and Y-directions) in a single scan.

According to an embodiment, an alignment mark for determining a two-dimensional alignment position of a substrate includes an array of patterns. The array of patterns includes a first set of patterns and a second set of patterns. The first set of patterns is arranged in a first sequence along a first direction. The second set of patterns is arranged in a second sequence along the first direction. The second sequence is different from the first sequence. Each pattern of the array of patterns is different from other patterns of the array of patterns that are adjacent to the each pattern.

In another embodiment, a lithographic system includes a substrate table, a patterning device, a projection system, and a substrate alignment system. The substrate table is configured to hold and move a substrate along a scanning direction. The patterning device is configured to impart a first radiation beam with a pattern of an alignment mark. The pattern includes a first set of patterns arranged in a first sequence along the scanning direction and a second set of patterns arranged in a second sequence along the scanning direction. The second sequence is different from the first sequence. Each pattern of the first and second sets of patterns is different from other patterns of the first and second sets of patterns, respectively. The projection system is configured to project an image of the pattern of the alignment mark on to the substrate. The substrate alignment system is configured to use the pattern of the alignment mark to determine alignment positions of the substrate along the scanning direction and a non-scanning direction that is perpendicular to the scanning direction.

Yet in another embodiment, a device manufacturing method includes holding a substrate using a substrate table that is moveable along a first direction and transferring a pattern of an alignment mark from a patterning device onto the substrate using a lithographic process. The pattern includes a first set of patterns arranged in a first sequence along the first direction and a second set of patterns arranged in a second sequence along the first direction. The second sequence is different from the first sequence. The method further includes scanning a measurement beam on the first or second set of patterns along the first direction, detecting an alignment signal produced from light reflected or diffracted off the scanned first or second set of patterns, and determining, based on the alignment signal, alignment positions of the substrate along the first direction and a second direction that is perpendicular to the first direction.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1A is a schematic illustration of a reflective lithographic apparatus according to an embodiment of the invention.

Figure 4A:
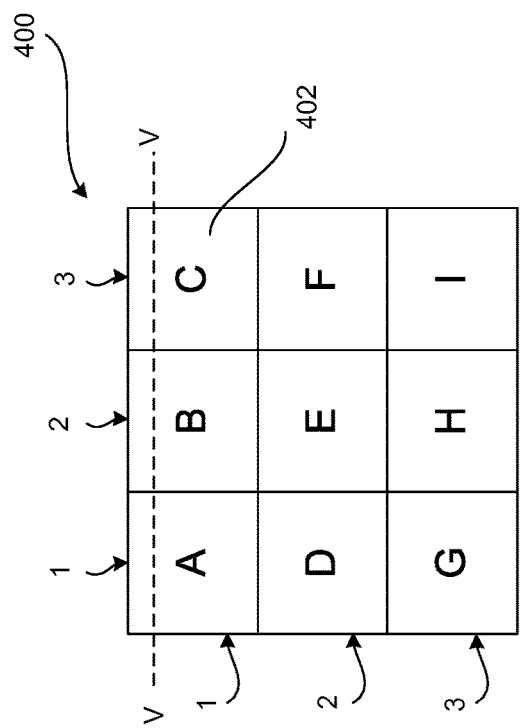
Figure 4B:
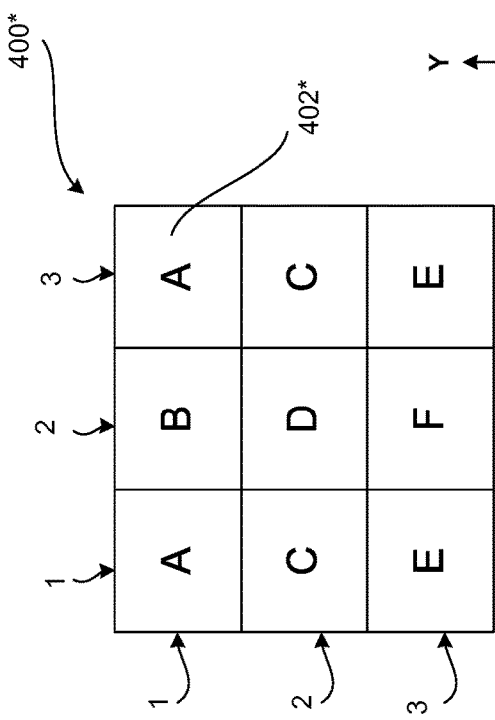
Figure 4C:
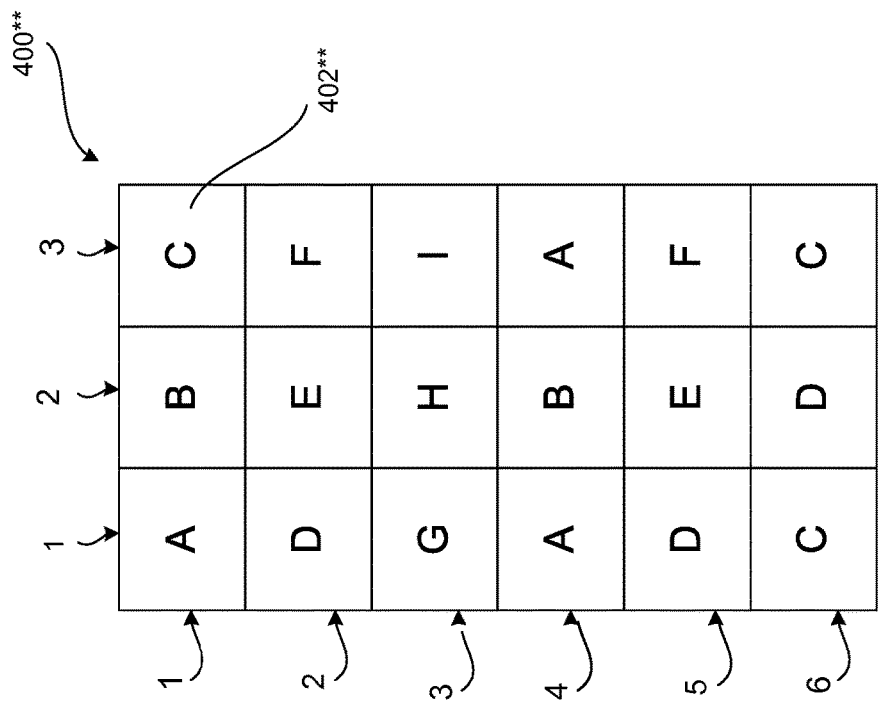

FIGS. 4A, 4B, and 4C are schematic illustrations of top views of an alignment mark, according to various embodiments of the invention.

Figure 5:
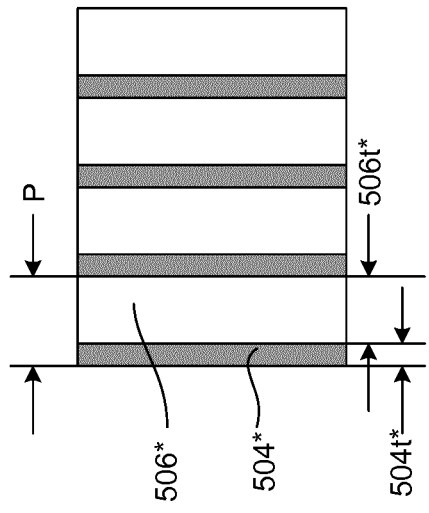
Figure 6:
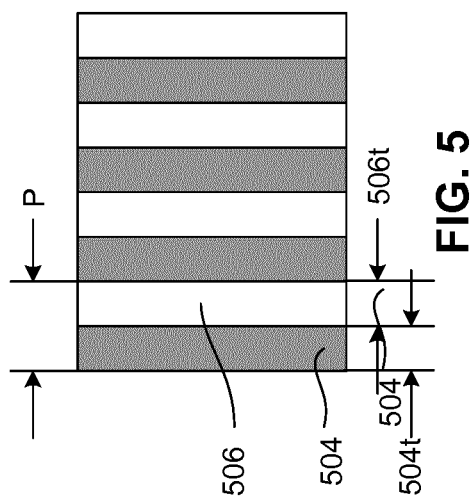
Figure 7:
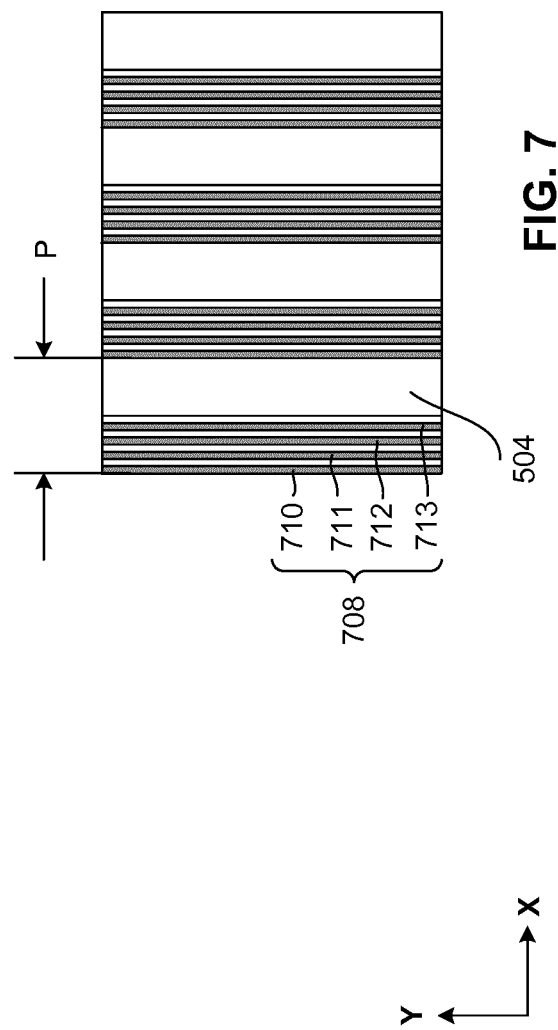

FIGS. 5-7 are schematic illustrations of patterns of an alignment mark, according to various embodiments of the invention.

Figure 8:
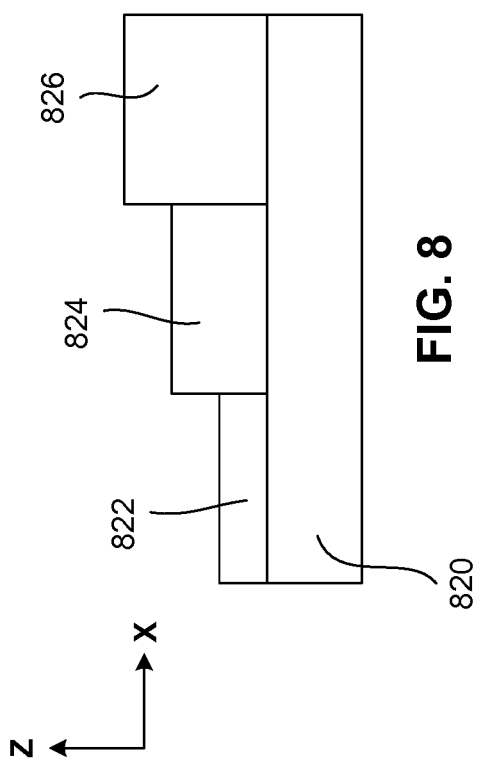
Figure 9:
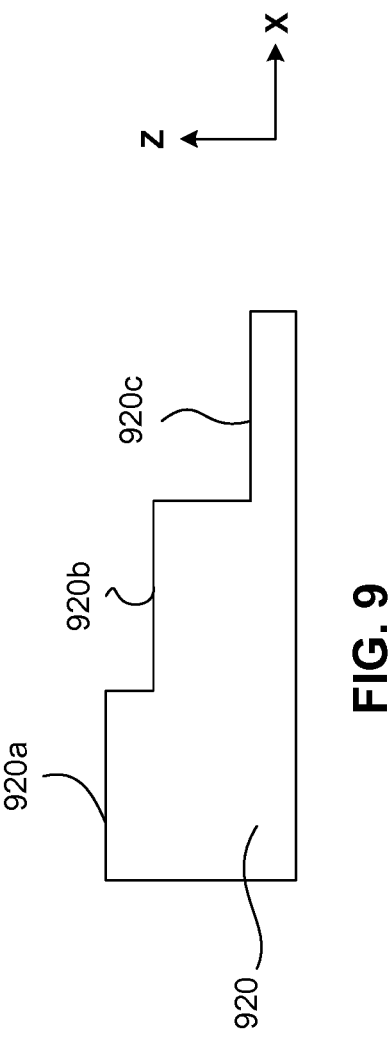

FIGS. 8-9 are schematic illustrations of cross-sectional views of an alignment mark, according to various embodiments of the invention.

Figure 10:
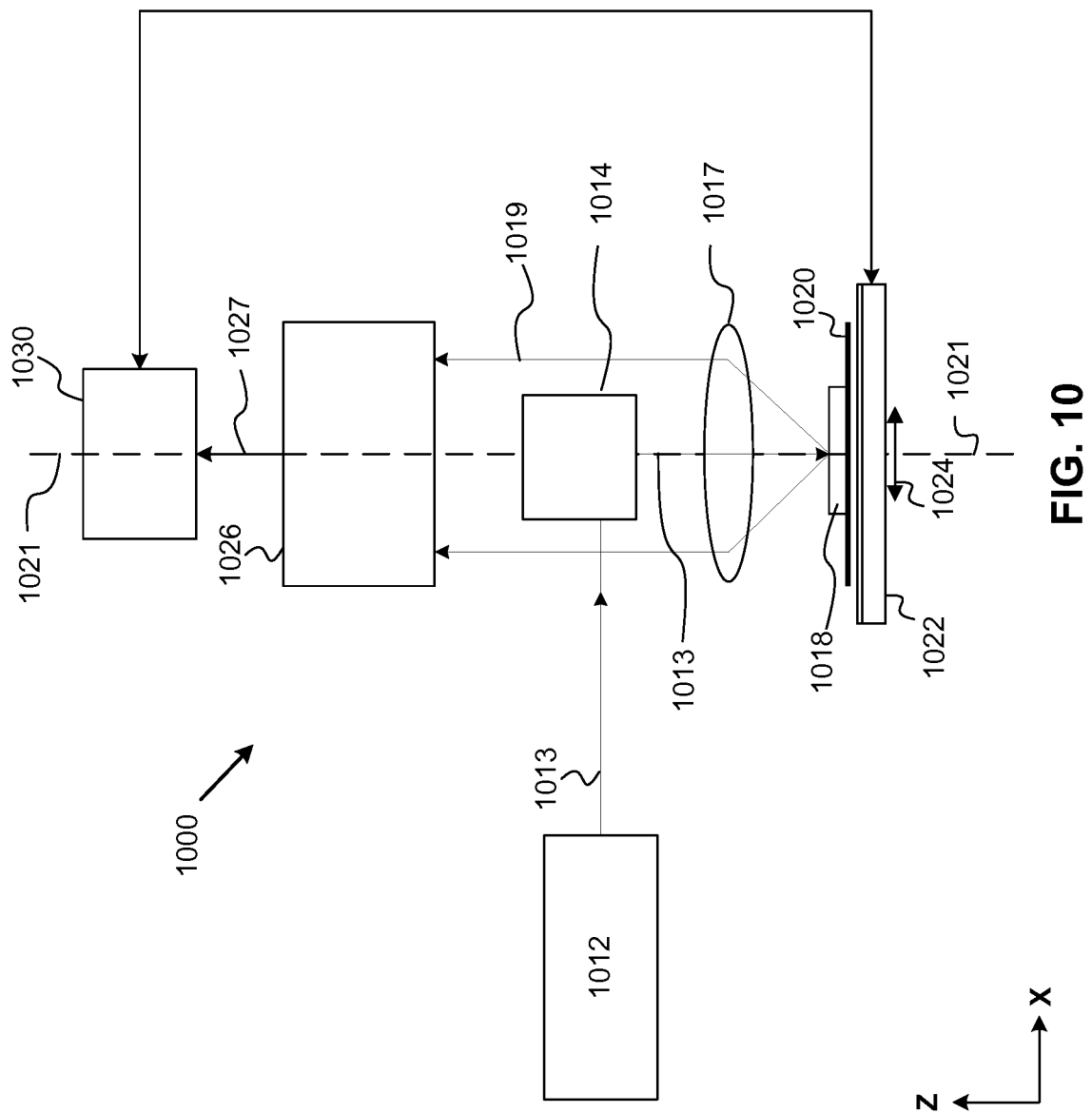

FIG. 10 is a schematic illustration of an alignment system, according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
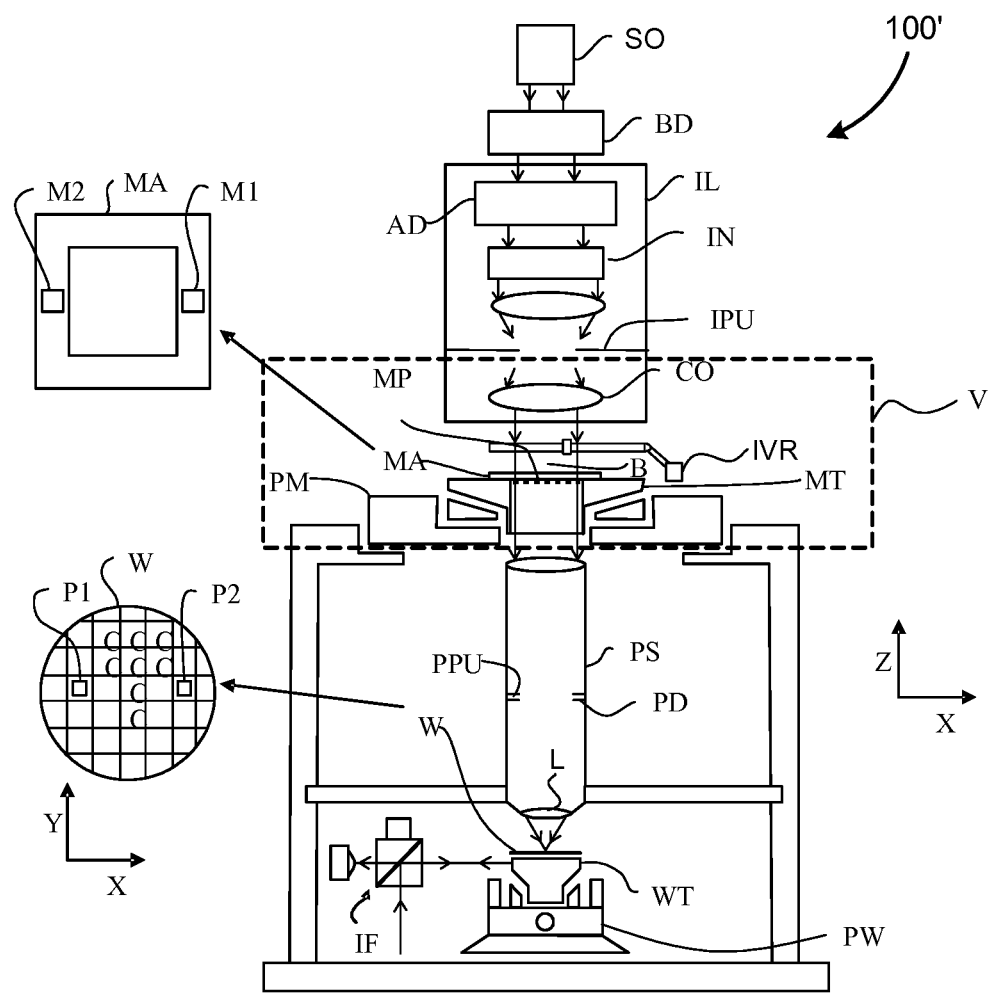
FIG. 1B is a schematic illustration of a transmissive lithographic apparatus according to an embodiment of the invention.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
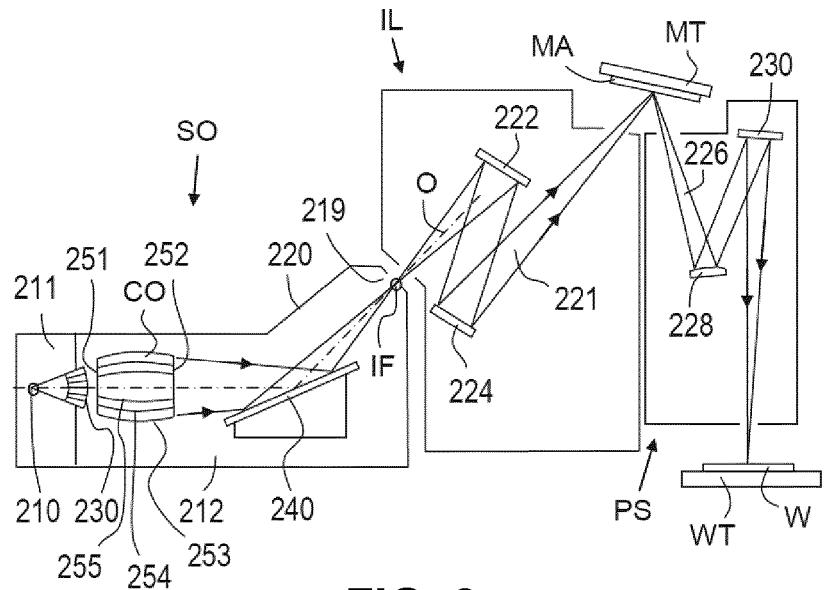
FIG. 2 is a more detailed schematic illustration of the reflective lithographic apparatus, according to an embodiment of the invention.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
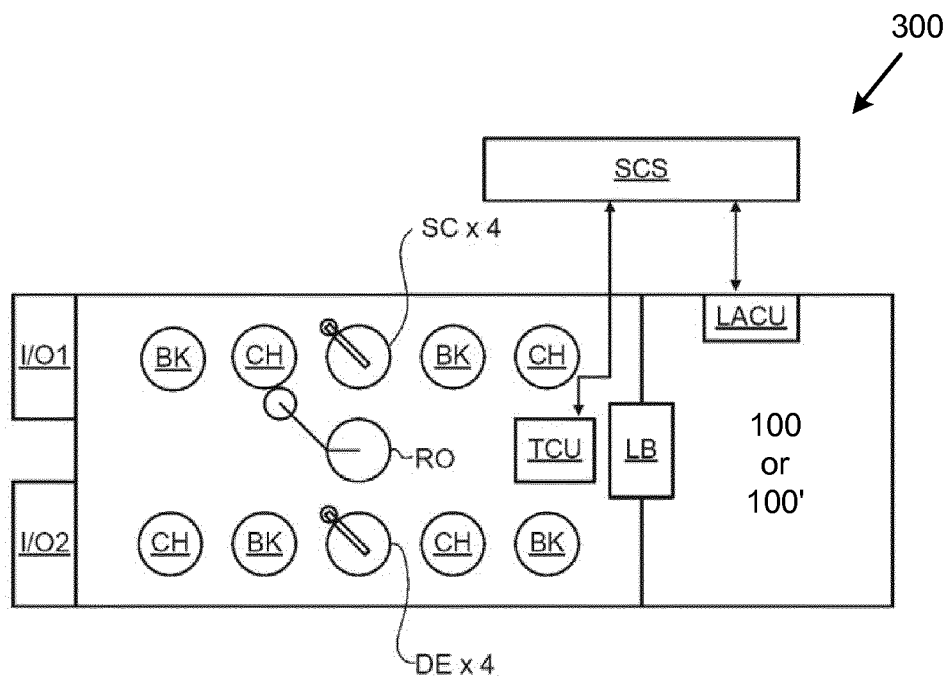
FIG. 3 is a schematic illustration of a lithographic cell, according to an embodiment of the invention.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Example Embodiments of Coarse Alignment Marks

The present disclosure provides various embodiments of a coarse alignment mark (CAM) on a substrate (e.g., wafer W). The CAM may be used in an alignment system for coarse wafer alignment (CWA) process discussed above.

Each of these embodiments of the CAM may be used to determine positions of the CAM, and consequently, positions of the substrate in two directions with respect to a wafer stage (e.g., wafer stage WT) holding the substrate, a fiducial part of the wafer stage, and/or an element of the alignment system. These two directions may be in the scanning (e.g., X-direction) and non-scanning directions (e.g., Y-direction) of the wafer stage. The positions in these two directions may be determined from a single measurement scan performed across the CAM by moving the wafer stage along the scanning direction (e.g., X-direction) under a measurement beam of the alignment system. Thus, these embodiments of the CAM may help to overcome the time and space problems (discussed above) of using two separate CAMs to determine 2D positions of a substrate in an alignment system. The alignment accuracy achieved using these embodiments of the CAM may be within about 100 nm.

According to an embodiment, FIG. 4A shows a schematic top view of a CAM 400 that may be used to determine positions of CAM 400 in both scanning (e.g., X-direction) and non-scanning directions (e.g., Y-direction). These positions may be determined with respect to a wafer stage (e.g., wafer stage WT) holding a substrate (e.g., wafer W) that may have CAM 400 formed on it. CAM 400 may be formed on the substrate in a lithographic process using a lithographic apparatus such as, for example, lithographic apparatus 100 or 100'. The lithographic process may involve transferring the patterns of CAM 400 from a patterning device to the substrate. In some embodiments, CAM 400 may be formed in scribe lanes and/or within device pattern areas on the substrate. In some embodiments, CAM 400 may be formed on the wafer stage and/or on a fiducial part of the wafer stage.

In some embodiments, CAM 400 may include an array of nine segments 402. For clarity, a 3×3 array of segments 402 in CAM 400 is shown in FIG. 4A. Based on the disclosure herein, a person of ordinary skill in the art will recognize that other sizes for the array of segments 402 are within the scope and spirit of this disclosure. CAM 400 may include one or more segments in each row and/or in each column of the array of segments 402, according to various embodiments. The size of the array of segments 402 may be selected for CAM 400 based on a particular alignment accuracy and/or an alignment system, and is not limited to the specific sizes of the array of segments described herein.

In some embodiments, each segment in the array of segments 402 may have a pattern, which is represented by a letter in FIG. 4A. Different letters indicate different patterns and similar letters indicate similar patterns. Each segment in the array of segments 402 may have vertical and horizontal dimensions (e.g., height and length) that are substantially equal to respective vertical and horizontal dimensions of the other segments in the array of segments 402.

As shown in FIG. 4A, each row of the array of segments 402 may have a sequence of patterns that is different from the other rows of the array of segments 402, according to some embodiments. For example, CAM 400 may have a first sequence of patterns (e.g., sequence ABC) in row 1, a second sequence of patterns (e.g., DEF) in row 2, and a third sequence of patterns (e.g., GHI) in row 3, where the first, second, and third sequences are different from each other. As such, each row of the array of segments 402 may provide a different and distinct combination of signals with respect to the other rows.

Each different pattern in the sequences of patterns may produce a different and distinct signal with respect to signals produced by the other patterns when illuminated, for example, by a measurement radiation beam during the CWA process. In some embodiments, these signals may be in the form of images, diffraction patterns and/or reflected light produced from the patterns (e.g., patterns A through I) when illuminated by the measurement beam. The differences between signals detected from different patterns may be due to, e.g., differences between the images, between properties of the images (e.g., intensity or contrast), between the diffraction patterns, between properties of the diffraction patterns (e.g., diffraction order, intensity, polarization state, or phase), and/or between reflective properties of the different patterns.

Each of these different and distinct combinations of signals may represent specific positions of CAM 400, with respect to the wafer stage, in the scanning and non-scanning directions. Thus, having a CAM, such as CAM 400, segmented with different patterns along both the scanning and non-scanning directions help to determine the CAM's position in both these directions in a single measurement scan.

In some embodiments, as shown in FIG. 4A, each segment in the array of segments 402 may have a pattern that is different from the patterns of the other segments in the array of segments 402. In alternate embodiments (not shown), each segment may have a pattern that is different from patterns in adjacent segments, but may be similar to patterns in non-adjacent segments in the array of segments 402.

To determine an alignment position of a CAM, such as CAM 400, during a CWA process, a measurement scan may be performed across CAM 400 along a scan path in the scanning direction (e.g., X-direction). The measurement scan may include moving the wafer stage in the X-direction, illuminating the scan path with a measurement beam, and detecting the signals from the light reflected and/or diffracted off the illuminated patterns along the scan path. The scan path may overlap one or more rows of the array of segments 402 depending on a dimension of the measurement beam spot on the substrate. The measurement beam spot may have a dimension (e.g., a diameter or a dimension along Y-axis) that is equal to or greater than the vertical dimension (e.g., a dimension along Y-axis) of each segment in the array of segments 402.

The detected signals may then be compared to previously measured or simulated signals of CAM 400 to find a best fit between them. The previously measured or simulated signals of CAM 400 may correspond to expected positions of CAM 400 with respect to the wafer stage. When a best fit is determined, the expected positions of CAM 400 in both the scanning and non-scanning direction that correspond to the best fit previously measured or simulated signals may be considered to be the alignment position of CAM 400 with respect to the wafer stage. Thus, having a CAM, such as CAM 400 segmented with different patterns along both the scanning and non-scanning directions help to determine the CAM's alignment position in both these directions in a single measurement scan.

In some embodiments, for higher alignment accuracy within about 100 nm in the non-scanning direction (e.g., Y-direction), the vertical dimension of each row is such that two or more adjacent rows of the array of segments 402 may be illuminated by the measurement beam, and consequently, signals from these two or more adjacent rows may be detected during the single measurement scan. This way, several data points may be detected for comparison with the previously measured or simulated signals and for finding the best fit for position in the non-scanning direction within about 100 nm accuracy.

In some embodiments, for higher alignment accuracy within about 100 nm in the non-scanning direction (e.g., Y-direction), two or more measurement scans may be performed across CAM 400 along different rows. In some embodiments, the different rows may be adjacent to each other along the non-scanning direction.

CAM 400 may be used in any suitable alignment system, such as, for example, self-referencing interferometers based alignment system, diffraction alignment sensor based alignment system, or camera based alignment system.

FIG. 4B shows a schematic top view of a CAM 400*, which may be an alternate embodiment of CAM 400. The description of CAM 400 applies to CAM 400*, unless mentioned otherwise. In some embodiments, CAM 400* may include an array of nine segments 402*. Based on the disclosure herein, a person of ordinary skill in the art will recognize that other sizes for the array of segments 402** are within the scope and spirit of this disclosure.

In some embodiments, each row of the array of segments 402* may have a sequence of patterns that is different from the other rows of the array of segments 402* and each sequence of patterns may be symmetrical about the non-scanning direction (e.g., Y-direction). For example, CAM 400* may have a first sequence of patterns (e.g., sequence ABA) in row 1, a second sequence of patterns (e.g., CDC) in row 2, and a third sequence of patterns (e.g., EFE) in row 3, where the first, second, and third sequences are different from each other and are symmetrical about Y-axis. Additionally or alternatively, the sequence of patterns in each column of the array of segments 402* may be symmetric about the scanning direction (e.g., X-direction).

CAM 400* may help in achieving higher alignment accuracy using, for example, self-referencing interferometer based alignment system. Typically, self-referencing interferometers may generate two images of a symmetric alignment mark, such as CAM 400*, rotate the two images 180" with respect to each other, and determine when the two images coincide with one another in order to determine the center of the alignment mark. In some embodiments, CAM 400* may be used in other suitable alignment system, such as, for example, diffraction alignment sensor based alignment system or camera based alignment system.

FIG. 4C shows a schematic top view of a CAM 400**, which may be an alternate embodiment of CAMs 400 and/or 400*. The description of CAMs 400 and 400* applies to CAM 400, unless mentioned otherwise. In some embodiments, CAM 400 may include an array of eighteen segments 402. Based on the disclosure herein, a person of ordinary skill in the art will recognize that other sizes for the array of segments 402 are within the scope and spirit of this disclosure.

In some embodiments, two or more rows of the array of segments 402 may have sequences of patterns that may be different from each other (e.g., rows 1, 3-4, and 6 of CAM 400). In addition, two or more rows of the array of segments 402 may have sequences of patterns that may be similar to each other (e.g., rows 2 and 5 of CAM 400). However, each of the rows having similar sequences of patterns (e.g., rows 2 and 5) may be inserted between a pair of rows (e.g., row 2 between rows 1 and 3, and row 5 between rows 4 and 6), where the sequences of patterns in the pairs of rows (e.g., rows 1 and 3 and rows 4 and 6) are different from each other. This arrangement of rows may help to distinguish between signals detected from the rows having similar sequences of patterns. That is, signals from patterns in rows adjacent to rows having similar sequences of patterns may help to identify the position of the row in CAM 400*, and consequently, determine the position of CAM 400** accurately in the non-scanning direction.

In some embodiments, one or more rows (e.g., rows 4 and 6) of the array of segments 402 may have sequence of patterns that may be symmetrical about the non-scanning direction (e.g., Y-direction). In some embodiments, one or more rows (e.g., rows 1-3 and 5) of the array of segments 402 may have sequence of patterns that may be non-symmetrical about the non-scanning direction (e.g., Y-direction). Additionally or alternatively, the sequence of patterns in one or more columns of the array of segments 402** may be symmetric about the scanning direction (e.g., X-direction).

In some embodiments, each segment of CAMs 400, 400*, and/or 400** may have a pattern including lines 504, spaces 506, and a pitch P, as shown in FIG. 5. Each of the different patterns in CAMs 400, 400*, and/or 400** may differ from each other based on their values of pitch P. For example, patterns A through I of FIGS. 4A-4C may each include lines and spaces (e.g., lines 504 and spaces 506), and each of patterns A through I may have a different value of pitch P. The different values of pitch P in different patterns may produce signals having different images and/or diffraction orders when the patterns are illuminated by the measurement beam, discussed above.

Based on the disclosure herein, a person of ordinary skill in the art will recognize that patterns of CAMs 400, 400*, and/or 400** may have different number of lines and spaces than the four lines and spaces shown in FIG. 5. The term "pitch" as used herein refers to a distance from a given point on one of the lines 504 to the same point on an adjacent line 504, as shown in FIG. 5.

The above discussed lines in the patterns of CAMs 400, 400*, and/or 400** may be formed from a first material such as a metal, according to some embodiments. The above discussed spaces in the patterns of CAMs 400, 400*, and/or 400** may be void or may include a second material with different optical properties than the first material. The second material may include silicon dioxide. Suitable combinations of first and second materials may include materials having a difference in reflectivity. Also first and second materials with properties that create a difference in phase contrast between lines and spaces may be used, according to some embodiments.

In some embodiments, each of the different patterns having lines (e.g., lines 504) and spaces (e.g., spaces 506) in CAMs 400, 400*, and/or 400** may differ from each other based on their values of pitch P and duty cycle. A duty cycle of a pattern having lines and spaces may be varied by varying the ratio of line thickness to space thickness. For example, the pattern in FIG. 5 has a first duty cycle of $504t:506t$, where $504t$ and $506t$ are the respective thicknesses of line 504 and space 506. The pattern in FIG. 6 has a second duty cycle of $504t^*:506t^*$, where $504t^*$ and $506t^*$ are the respective thicknesses of line 504* and space 506*. The different values of pitch P and duty cycles in the different patterns of CAMs 400, 400*, and/or 400** may produce signals having different images and/or diffraction patterns having different intensities and diffraction orders when the patterns are illuminated by the measurement beam.

In alternate embodiments, each of the different patterns in CAMs 400, 400*, and/or 400** may have the same pitch P, but a different value of duty cycle. The same pitch P and different duty cycles in the different patterns CAMs 400, 400*, and/or 400** may produce signals having different images and/or diffraction patterns having the same diffraction order and different intensities, when the patterns are illuminated by the measurement beam.

FIG. 7 shows each of lines 708 having a plurality of sub-segments 710 through 713, according to some embodiments. Additionally or alternatively to lines 506, each of the different patterns in CAMs 400, 400*, and/or 400** may have lines such as, lines 708. The lines of the different patterns may be sub-segmented as lines 708. Each of the different patterns may differ from each other based on the number of sub-segments included in their lines. The different number of sub-segments in the different patterns of CAMs 400, 400*, and/or 400** may produce signals having different images and/or polarization states when the patterns are illuminated by the measurement beam.

FIG. 8 shows a cross-sectional view of row 1 of FIG. 4A along line V-V, according to some embodiments. In some embodiments, each of the different patterns in CAMs 400, 400*, and/or 400** may differ from each other based on their height along Z-axis. For example, pattern A may include a reflective material 822 having a first height on a substrate 820, pattern B may include a reflective material 824 having a second height on a substrate 820, and pattern C may include a reflective material 826 having a third height on a substrate 820. The first, second, and third heights may be different from each other. In some embodiments, reflective materials 822, 824, and 826 may be the same or different from each other. Substrate 820 may be the substrate (e.g., wafer W) held by the wafer stage (e.g., wafer stage WT), a surface of the wafer stage, and/or a fiducial part of the wafer stage.

In some embodiments, the above discussed patterns A through I may also differ from each other based on the height of their pattern lines (e.g., lines 504). The lines of different patterns may have different heights along Z-axis.

In alternate embodiments, the different heights may be formed in the different patterns by etching different depths into a substrate (e.g., wafer W) and forming one or more of the above discussed patterns on the etched surfaces. For example, FIG. 9 shows a cross-sectional view of row 1 of FIG. 4A along line V-V, according to an embodiment. For clarity, patterns A, B, and C are not shown in FIG. 9. Pattern A may be formed on a top surface 920s of a substrate 920. Pattern B may be formed on an etched surface 920b of substrate 920. The etched surface 920b may be lower than surface 920a by a first distance. Pattern C may be formed on an etched surface 920c of substrate 920. The etched surface 920c may be lower than surface 920b by a second distance. The first and second distances may be same or different, according to some embodiments. Substrate 820 may be the substrate (e.g., wafer W) held by the wafer stage (e.g., wafer stage WT), a surface of the wafer stage, and/or a fiducial part of the wafer stage.

The different heights in different patterns may produce signals having different images and/or diffraction patterns having different intensities when the patterns are illuminated by the measurement beam.

Based on the disclosure herein, a person of ordinary skill in the art will recognize that other patterns and variation in pattern features for CAMs 400, 400*, and/or 400** are within the scope and spirit of this disclosure.

Alignment System According to an Embodiment

FIG. 10 illustrates a schematic of a cross-sectional view of an alignment system 1000 that may be implemented as a part of a lithographic system having lithographic apparatus 100 or 100', according to an embodiment. Alignment system 1000 is an example environment in which embodiments of a coarse alignment mark (CAM) of the present invention may be used.

Alignment system 1000 may be configured to align a substrate (e.g., substrate W) with respect to a patterning device (e.g., patterning device MA). Alignment system 1000 may be further configured to detect positions of alignment marks such as, for example CAMs 400, 400*, and/or 400** on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, alignment system 1000 may include an illumination system 1012, an optical system 1014, an objective system 1017, a detection system 1026, and an analyzer 1030, according an embodiment. Illumination system may be configured to provide an electromagnetic narrow band radiation beam 1013 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Yet in another example, radiation beam 1013 may be monochromatic, for example, provided by a monochromatic light source, such as a laser light source in illumination system 1012. But polychromatic light sources such as LEDs may also be used in illumination system 1012 to provide a polychromatic radiation beam 1013.

Optical system 1014 may be configured to receive radiation beam 1013 and direct radiation beam 1013 onto a substrate 1020 placed on a stage 1022 moveable along direction 1024. Optical system 1014 may be configured to focus radiation beam 1013 into a measurement beam spot on substrate 1020 to illuminate an alignment mark 1018 (e.g., CAMs 400, 400*, and/or 400**) located on substrate 1020. Optical system 1014 may include a beam splitter (not shown). In an example, radiation beam 1013 may be split into radiation sub-beams before being directed to substrate 1020.

As illustrated in FIG. 10, objective system 1017 may be configured to direct reflected and/or diffracted radiation beam 1017 towards detection system 1026, according to an embodiment. Objective system 1017 may include any appropriate number of optical elements suitable for directing reflected and/or diffracted radiation beam 1019. Radiation beam 1019 may be at least a portion of radiation beam 1013 that is reflected and/or diffracted from alignment mark 1018. It should be noted that even though radiation beam 1019 has been shown to pass outside optical system 1014 in FIG. 10, the disclosure in not so limiting. Optical system 1014 may be substantially transparent to radiation beam 1019 and may allow radiation beam 1019 to pass through it without substantially changing the properties of radiation beam 1019. It should be further noted that even though objective system 1017 is shown to direct radiation beam 1019 towards detection system 1026, the disclosure is not so limiting. It would be apparent to a person skilled in the relevant art that other optical arrangements may be used to obtain the similar result of detecting signals from alignment mark 418.

In some embodiments, detection system 1026 may include a self-referencing interferometer (not shown) that may include any appropriate set of optical-elements, for example, a combination of prisms that may be configured to form two images of alignment mark 1018 based on the received radiation beam 1019. Self-referencing interferometer may be further configured to rotate one of the two images with respect to the other of the two images one hundred and eighty degrees and recombine the rotated and unrotated images interferometrically.

Detection system 1026 may be further configured to receive the recombined image and detect an interference as a result of the recombined image when alignment axis 1021 of alignment system 1000 passes through a center of symmetry (not shown) of alignment mark 1018. Based on the detected interference, detection system 1026 may be further configured to determine a position of the center of symmetry of alignment mark 1018 and consequently, detect alignment positions of alignment mark 1018 in both the scanning direction 1024 and the non-scanning direction (e.g., Y-direction). According to an example, alignment axis 1021 may be aligned with an optical beam perpendicular to substrate 1020 and passing through a center of detection system 1026.

In alternate embodiments, detection system 1026 may include an imaging device such as, for example, a camera (not shown) instead of the self-referencing interferometer. The imaging device may capture one or more images of the illuminated area of alignment mark 1018 from the received radiation beam 1019. Based on the captured one or more images, detection system 1026 may be further configured to determine alignment positions of alignment mark 1018 in both the scanning direction 1024 and the non-scanning direction (e.g., Y-direction).

In alternate embodiments, detection system 1026 may include a diffraction alignment sensor (not shown) instead of the self-referencing interferometer or the imaging device discussed above. The diffraction alignment sensor may detect one or more diffraction patterns from the received radiation beam 1019. Based on the detected one or more diffracted patterns, detection system 1026 may be further configured to determine alignment positions of alignment mark 1018 in both the scanning direction 1024 and the non-scanning direction (e.g., Y-direction).

In a further embodiment, analyzer 1030 may be configured to receive signal 1029 including information of the alignment positions of alignment mark 1018. Analyzer 1030 may be further configured to determine a position of stage 1022 and correlate the position of stage 1022 with the determined alignment positions of alignment mark 1018. As such, the position of alignment mark 1018 and consequently, the position of substrate 1020 may be accurately known with reference to stage 1022.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

The term "in substantial contact" as used herein generally describes elements or structures that are in physical contact with each other with only a slight separation from each other which typically results from misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include misalignment tolerances without departing from the spirit and scope of the present disclosure.

The term "optically coupled" as used herein generally refers to one coupled element being configured to impart light to another coupled element directly or indirectly.

The term "optical material" as used herein generally refers to a material that allows light or optical energy to propagate therein or therethrough.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. An alignment mark for determining a two-dimensional alignment position of a substrate, the alignment mark comprising:
    an array of patterns comprising:
        a first set of patterns arranged in a first sequence along a first direction; and
        a second set of patterns arranged in a second sequence along the first direction, the second sequence being different from the first sequence,
    wherein each pattern of the array of patterns is different from other patterns of the array of patterns that are adjacent to the each pattern, and
    wherein one of:
        each pattern of the first and second sets of patterns comprises a pattern pitch that is different from pattern pitches of other patterns of the first and second sets of patterns, respectively, or
        each pattern of the first and second sets of patterns comprises a pattern duty cycle that is different from pattern duty cycles of other patterns of the first and second sets of patterns, respectively.

2. The alignment mark of claim 1, wherein each pattern of the first and second sets of patterns is different from other patterns of the first and second sets of patterns, respectively.

3. The alignment mark of claim 1, wherein each pattern of the first and second sets of patterns has a vertical dimension that is different from vertical dimensions of other patterns of the first and second sets of patterns, respectively.

4. The alignment mark of claim 1, wherein a pattern of the first or second sets of patterns has a sub-pattern.

5. The alignment mark of claim 1, wherein the first and second sets of patterns are symmetrical about a second direction that is perpendicular to the first direction.

6. The alignment mark of claim 1, further comprising a third set of patterns arranged in the first sequence along the first direction, the third set of patterns being separated from the first set of patterns by at least two sets of patterns of the array of patterns, each of the at least two sets of patterns arranged in a sequence that is different from each other and different from the first and second sequences.

7. The alignment mark of claim 1, further comprising a third set of patterns arranged in a third sequence along a second direction that is perpendicular to the first direction.

8. The alignment mark of claim 1, wherein the array of patterns is on the substrate.

9. The alignment mark of claim 1, wherein the array of patterns is on a substrate table configured to hold and move the substrate during the determining of the two-dimensional alignment position of the substrate.

10. A lithographic system comprising:
    a substrate table configured to hold and move a substrate along a scanning direction;
    a patterning device configured to impart a first radiation beam with a pattern of an alignment mark, the pattern comprising:
        a first set of patterns arranged in a first sequence along the scanning direction, and
        a second set of patterns arranged in a second sequence along the scanning direction, the second sequence being different from the first sequence,
        wherein each pattern of the first and second sets of patterns is different from other patterns of the first and second sets of patterns, respectively, and
        wherein one of:
            each pattern of the first and second sets of patterns comprises a pattern pitch that is different from pattern pitches of other patterns of the first and second sets of patterns, respectively, or
            each pattern of the first and second sets of patterns comprises a pattern duty cycle that is different from pattern duty cycles of other patterns of the first and second sets of patterns, respectively;
    a projection system configured to project an image of the pattern of the alignment mark on to the substrate; and
    a substrate alignment system configured to use the pattern of the alignment mark to determine alignment positions of the substrate along the scanning direction and a non-scanning direction that is perpendicular to the scanning direction.

11. The lithographic system of claim 10, wherein the substrate alignment system comprises an optical system configured to focus a second radiation beam into a measurement beam spot on the substrate, the measurement beam spot being configured to illuminate the first or second set of patterns during operation of the substrate alignment system.

12. The lithographic system of claim 11, wherein a dimension of the measurement beam spot is larger than dimensions of the first or second set of patterns along the non-scanning direction.

13. The lithographic system of claim 10, wherein the substrate alignment system comprises a detection system configured to:

detect a signal produced from light reflected or diffracted off the first or second set of patterns when illuminated during operation of the substrate alignment system; and determine the alignment positions of the substrate along the scanning and non-scanning directions based on the detected signal.

14. The lithographic system of claim 13, wherein the detection system comprises a self-referencing interferometer.

15. The lithographic system of claim 13, wherein the detection system comprises a camera based imaging device.

16. The lithographic system of claim 13, wherein the detection system comprises a diffraction alignment sensor.

17. A device manufacturing method comprising:

holding a substrate using a substrate table that is moveable along a first direction;

transferring a pattern of an alignment mark from a patterning device onto the substrate using a lithographic process, the pattern comprising:

a first set of patterns arranged in a first sequence along the first direction, a second set of patterns arranged in a second sequence along the first direction, the second sequence being different from the first sequence, and wherein one of:

each pattern of the first and second sets of patterns comprises a pattern pitch that is different from pattern pitches of other patterns of the first and second sets of patterns, respectively, or each pattern of the first and second sets of patterns comprises a pattern duty cycle that is different from pattern duty cycles of other patterns of the first and second sets of patterns, respectively;

scanning a measurement beam on the first or second set of patterns along the first direction;

detecting an alignment signal produced from light reflected or diffracted off the scanned first or second set of patterns; and determining, based on the alignment signal, alignment positions of the substrate along the first direction and a second direction that is perpendicular to the first direction.

18. The device manufacturing method of claim 17, wherein the alignment signal comprises a signal from each pattern of the scanned first or second set of patterns.

19. The device manufacturing method of claim 17, wherein the alignment signal comprises a diffraction signal from each pattern of the scanned first or second set of patterns.

20. The device manufacturing method of claim 17, further comprising:

scanning first and second measurement beams on the first and second sets of patterns along the first direction, respectively;

detecting first and second alignment signals produced from the light reflected or diffracted off the scanned first and second sets of patterns, respectively; and determining, based on the first and second alignment signals, alignment positions of the substrate along the first and second directions.

21. The device manufacturing method of claim 20, wherein the first and second sets of patterns are adjacent to each other along the second direction.

* * * * *